United States Patent
Arberet et al.

(10) Patent No.: US 10,866,298 B2
(45) Date of Patent: Dec. 15, 2020

(54) LOW RANK AND SPATIAL REGULARIZATION MODEL FOR MAGNETIC RESONANCE FINGERPRINTING

(71) Applicant: Siemens Healthcare GmbH, Erlangen (DE)

(72) Inventors: Simon Arberet, Princeton, NJ (US); Xiao Chen, Princeton, NJ (US); Boris Mailhe, Plainsboro, NJ (US); Mariappan S. Nadar, Plainsboro, NJ (US); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 153 days.

(21) Appl. No.: 16/045,022

(22) Filed: Jul. 25, 2018

(65) Prior Publication Data
US 2019/0041480 A1    Feb. 7, 2019

Related U.S. Application Data

(60) Provisional application No. 62/540,801, filed on Aug. 3, 2017.

(51) Int. Cl.
*G01R 33/56* (2006.01)
*G01R 33/48* (2006.01)
*G01R 33/50* (2006.01)
*G06K 9/00* (2006.01)
*G06K 9/62* (2006.01)

(52) U.S. Cl.
CPC ..... *G01R 33/5608* (2013.01); *G01R 33/4824* (2013.01); *G01R 33/50* (2013.01); *G01R 33/5602* (2013.01); *G06K 9/0002* (2013.01); *G06K 9/6247* (2013.01)

(58) Field of Classification Search
CPC ............... G01R 33/5608; G01R 33/50; G01R 33/4824; G01R 33/5602; G06K 9/0002; G06K 9/6247
USPC ........................................................ 324/309
See application file for complete search history.

(56) References Cited

U.S. PATENT DOCUMENTS

| | | | | |
|---|---|---|---|---|
| 9,691,168 | B2 * | 6/2017 | Song | G06T 11/006 |
| 2008/0292163 | A1 * | 11/2008 | DiBella | G01R 33/561 |
| | | | | 382/131 |
| 2014/0286560 | A1 * | 9/2014 | Trzasko | G01R 33/5611 |
| | | | | 382/131 |

(Continued)

OTHER PUBLICATIONS

Doneva, M., Amthor, T., Koken, P., Sommer, K. and Bornert, P., 2017. Matrix completion-based reconstruction for undersampled magnetic resonance fingerprinting data. Magnetic resonance imaging, 41, pp. 41-52. (Year: 2017).*

(Continued)

*Primary Examiner* — Christopher P McAndrew

(57) ABSTRACT

Systems and methods are provided for iterative reconstruction of a magnetic resonance image using Magnetic Resonance Fingerprinting (MRF). An image series is estimated according to the following three steps: a gradient step to improve data consistency, fingerprint matching, and a spatial regularization. Singular Value Decomposition (SVD) compression may be used along the time dimension to accelerate both the matching and the spatial regularization that operates in the compressed domain as well as to enforce low-rank regularization.

9 Claims, 6 Drawing Sheets

(56) References Cited

U.S. PATENT DOCUMENTS

| | | | | |
|---|---|---|---|---|
| 2015/0302579 | A1* | 10/2015 | Griswold | G01R 33/5608 382/128 |
| 2015/0346301 | A1* | 12/2015 | Cauley | G01R 33/4828 324/309 |
| 2017/0115368 | A1* | 4/2017 | Chen | G01R 33/4824 |
| 2017/0138870 | A1* | 5/2017 | Buijsse | G01N 23/04 |
| 2017/0186194 | A1* | 6/2017 | Koehler | A61B 6/5282 |
| 2017/0206662 | A1* | 7/2017 | Wang | G06T 7/143 |

OTHER PUBLICATIONS

Kustner, T., Wurslin, C., Gatidis, S., Martirosian, P., Nikolaou, K., Schwenzer, N.F., Schick, F., Yang, B. and Schmidt, H., 2016. MR image reconstruction using a combination of compressed sensing and partial Fourier acquisition: ESPReSSo. IEEE transactions on medical imaging, 35(11), pp. 2447-2458. (Year: 2016).*

Saha, S. and Bandyopadhyay, S., Sep. 2007,. MRI brain image segmentation by fuzzy symmetry based genetic clustering technique. In 2007 IEEE Congress on Evolutionary Computation (pp. 4417-4424). IEEE. (Year: 2007).*

Li, Y., Jia, F. and Qin, J., 2016. Brain tumor segmentation from multimodal magnetic resonance images via sparse representation. Artificial intelligence in medicine, 73, pp. 1-13. (Year: 2016).*

Chen, Xiao, et al. "Iterative Magnetic Resonance Fingerprinting Reconstruction." U.S. Appl. No. 15/332,336.

Davies, Mike, et al. "A compressed sensing framework for magnetic resonance fingerprinting." SIAM Journal on Imaging Sciences 7.4 (2014): 2623-2656.

Doneva, Mariya, et al. "Matrix completion-based reconstruction for undersampled magnetic resonancefingerprinting data." Magnetic Resonance Imaging (2017), pp. 1-30.

Mazor, Gal, et al. "Low rank magnetic resonance fingerprinting." Engineering in Medicine and BiologySociety (EMBC), 2016 IEEE 38th Annual International Conference of the. IEEE, 2016.

Wang, Zhe, et al. "Magnetic resonance fingerprinting with compressed sensing and distance metriclearning." Neurocomputing 174 (2016): 560-570.

Zhao, Bo, et al. "Improved magnetic resonance fingerprinting reconstruction with low-rank and subspace modeling." Magnetic resonance in medicine 79.2 (2018): 933-942.

* cited by examiner

LOW RANK AND SPATIAL REGULARIZATION MODEL FOR MAGNETIC RESONANCE FINGERPRINTING

CROSS REFERENCE TO RELATED APPLICATIONS

This application claims the benefit of U.S. Provisional Application No. 62/540,801, filed Aug. 3, 2017, which is hereby incorporated by reference in its entirety.

FIELD

The present embodiments relate to medical image processing.

BACKGROUND

Magnetic resonance fingerprinting is a technique for multi-parametric quantitative imaging. The technique aims to obtain multiple parameters, such as spin-lattice relaxation time (T1) (also known as the longitudinal relaxation time), spin-spin transverse relaxation time (T2) (also known as the transverse relaxation time), proton density (PD), etc., for an object by applying a series of excitations to the object, acquiring a signal response of the object to the series of excitations, and matching the undersampled signal response to a simulated response found in a dictionary or database of possible simulated responses.

Each simulated response stored in the dictionary is generated by running Bloch equations with relevant values for magnetic resonance parameters (T1, T2, PD, etc.). Once a match is found between the undersampled signal response and a simulated response in the dictionary, the magnetic resonance parameters (T1, T2, PD, etc.) corresponding to the matched simulated response may be retrieved from the dictionary and used for further imaging purposes. For a single iteration, the amount of data in an MR signal is not enough to provide a match to the dictionary entry with sufficient accuracy. Iterative processes are therefore employed to help refine the dictionary matching process. However, iterative processes require the repetition of various computationally expensive steps, such as dictionary search steps and signal comparison steps.

SUMMARY

By way of introduction, the preferred embodiments described below include methods and systems for an iterative gradient proximal process for Magnetic Resonance Fingerprinting. The process incorporates spatial and low rank regularization in the reconstruction. Low rank is imposed by compressing the fingerprint dictionary much beyond the rank of the dictionary or by using autocalibration data.

In a first aspect, a method is provided for obtaining a magnetic resonance image of an object. A compressed image is acquired from one or more magnetic resonance k-space signals obtained from the object. A dictionary is compressed to a value of a low rank. The magnetic resonance image is iteratively reconstructed. The magnetic resonance image is displayed. Each iteration includes: updating a gradient of the compressed image, performing a search of the compressed dictionary to select a magnetic resonance fingerprint representative, generating an updated compressed image using the magnetic resonance fingerprint representative, and applying regularization to the updated compressed image; wherein the updated compressed image is used as input for a subsequent iteration.

In a second aspect, a method is provided for generating a magnetic resonance image of an object. A compressed image is acquired from one or more magnetic resonance k-space signals obtained from the object. A dictionary is compressed to a value of its rank. The compressed dictionary is multiplied by an additional compression matrix obtained via a Singular Value Decomposition algorithm applied on auto-calibration data. Data fidelity is performed on the compressed image. The compressed dictionary is searched for a representative magnetic resonance fingerprint. An updated compressed image is generated using the representative magnetic resonance fingerprint. Spatial regularization is applied to the updated compressed image. Performing, searching, generating and applying is repeated for at least two iterations for the updated compressed image.

In a third aspect, a system is provided for generating an image using magnetic resonance fingerprinting. The system includes a magnetic resonance imaging device, a control unit, a memory, and an image processor. The magnetic resonance imaging device is configured to acquire MR data. The control unit includes the memory and the image processor. The memory is configured to store a compressed dictionary of magnetic resonance fingerprints, the compressed dictionary compressed to a value of a rank of a contrast images data volume reshaped in a matrix form of size comprising a number of pixels multiplied by a number of time points. The image processor is configured to iteratively construct the image from the MR data using the compressed dictionary of magnetic resonance fingerprints.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION

An iterative gradient proximal process for Magnetic Resonance Fingerprinting (MRF) is provided where an estimated image series is estimated according to the following three steps: a gradient step to improve data consistency, fingerprint matching, and a spatial regularization. Singular Value Decomposition (SVD) compression may be used along the time dimension to accelerate both the matching and the spatial regularization that operates in the compressed domain as well as to enforce low-rank regularization.

Magnetic Resonance Fingerprinting (MRF) permits the non-invasive quantification of multiple properties of a material or tissue simultaneously through an approach to data acquisition, post-processing and visualization. MRF provides a mechanism to quantitatively detect and analyze complex changes that may represent physical alterations of a substance or early indicators of disease. MRF may also be used to specifically identify the presence of a target material or tissue, that may increase the sensitivity, specificity, and speed of an MR study, and potentially lead to new diagnostic testing methodologies. When paired with an appropriate pattern recognition algorithm, MRF inherently suppresses measurement errors and thus may improve accuracy compared to previous approaches.

Figure 1:
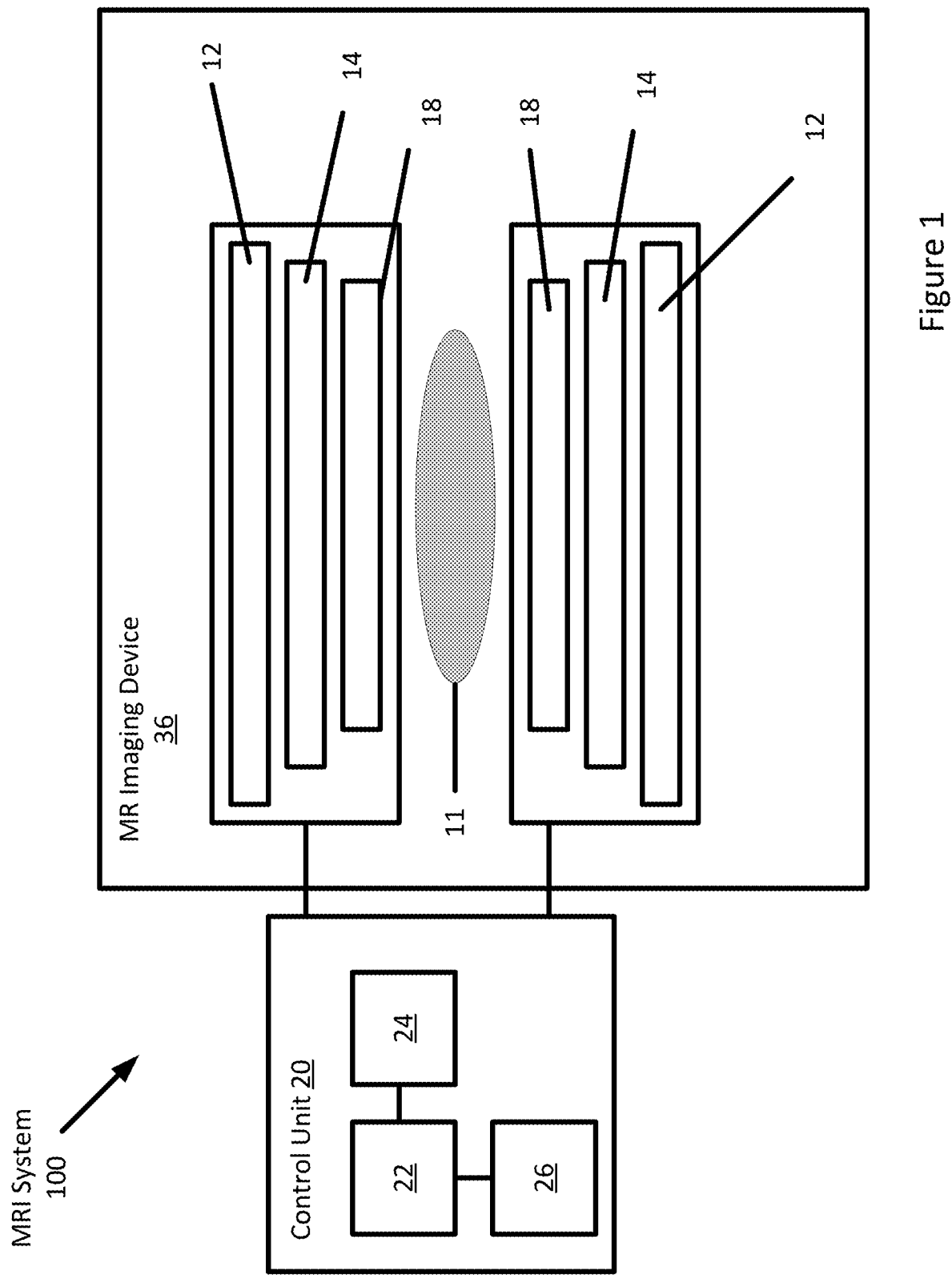
FIG. 1 depicts an example MRI system.

FIG. 1 depicts an MRI system 100 for acquisition of frequency domain components representing Magnetic Resonance (MR) data for storage in a storage array. The MRI system 100 includes a control unit 20 that is configured to process the MR signals and generate images of the body for display to an operator. The control unit 20 may store the MR signals and data for later processing or viewing in a memory 24. The control unit 20 may include a display 26 for presentation of images to an operator. The MR scanning system 100 is only exemplary, and a variety of MR scanning systems may be used to collect the MR data.

In the MRI system 100, magnetic coils 12 create a static base or main magnetic field in the body of patient 11 or an object positioned on a table and imaged. Within the magnet system are gradient coils 14 for producing position dependent magnetic field gradients superimposed on the static magnetic field. Gradient coils 14, in response to gradient signals supplied thereto by a gradient and control unit 20, produce position dependent and shimmed magnetic field gradients in three orthogonal directions and generate magnetic field pulse sequences. The shimmed gradients compensate for inhomogeneity and variability in an MR imaging device magnetic field resulting from patient anatomical variation and other sources.

The control unit 20 may include a RF (radio frequency) module that provides RF pulse signals to RF coil 18, that produces magnetic field pulses that rotate the spins of the protons in the imaged body of the patient 11 by ninety degrees or by one hundred and eighty degrees for so-called "spin echo" imaging, or by angles less than or equal to 90 degrees for "gradient echo" imaging. Gradient and shim coil control modules in conjunction with RF module, as directed by control unit 20, control slice-selection, phase-encoding, readout gradient magnetic fields, radio frequency transmission, and magnetic resonance signal detection, to acquire magnetic resonance signals representing planar slices of the patient 11.

In response to applied RF pulse signals, the RF coil 18 receives MR signals, e.g. signals from the excited protons within the body as the protons return to an equilibrium position established by the static and gradient magnetic fields. The MR signals are detected and processed by a detector within RF module and the control unit 20 to provide an MR dataset to an image data processor 22 for processing. In some embodiments, the image data processor 22 is located in the control unit 20, in other embodiments, the image data processor 22 is located remotely. A two or three-dimensional k-space storage array of individual data elements in a memory 24 of the control unit 20 stores corresponding individual frequency components including an MR dataset. The k-space array of individual data elements includes a designated center, and individual data elements individually include a radius to the designated center.

MRF utilizes the fact that each tissue responds differently to a pulse sequence. By varying the acquisition parameters (e.g. repetition time (TR), echo time (TE), and radio frequency flip angle (FA)), unique signals are generated from different tissues. After acquisition, a search function is used to match the acquired signal from each voxel to an entry from a dictionary of possible tissue candidates. The dictionary entries are created by simulating the tissue's response to the sequence for a range of T1 and T2 parameter values, using Bloch equations. The resulting dictionary contains the temporal signatures of various simulated materials, given the pseudo-random pulse sequence. The quantitative parameters, such as the tissue's T1 and T2 relaxation times, may be retrieved from the data by matching the signature acquired to the most correlated entry in the dictionary.

Figure 2:
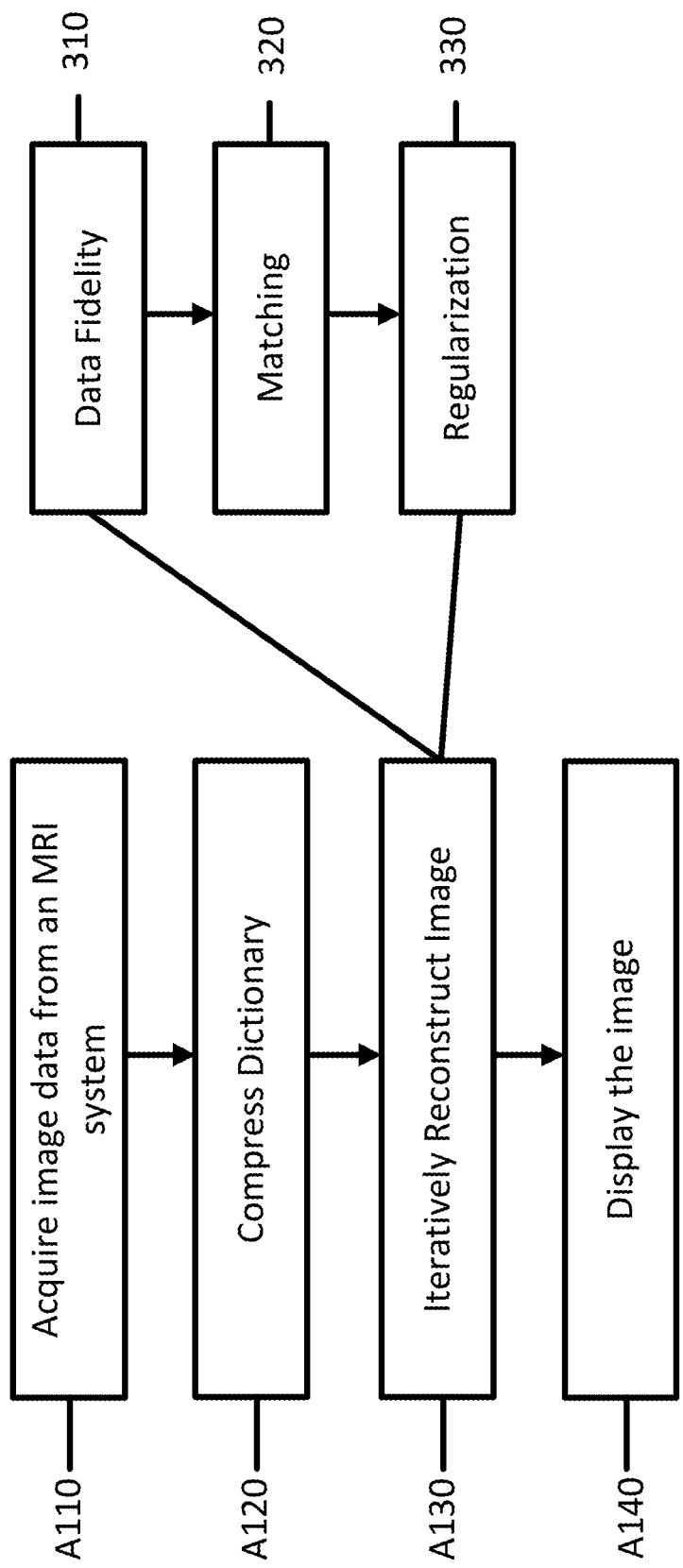
FIG. 2 depicts an example method for generating an image using magnetic resonance fingerprinting.

FIG. 2 depicts an example method for generating an image using MRF. The acts are performed by the system of FIG. 1, FIG. 3, FIG. 6, other systems, a workstation, a computer, and/or a server. Additional, different, or fewer acts may be provided. The acts are performed in the order shown (e.g., top to bottom) or other orders.

At act A110, an object is scanned by the magnetic resonance imaging system to acquire MR data. As depicted and described in FIG. 1 above, the MR data may be acquired using MR scanners. For example, gradient coils, a whole-body coil, and/or local coils generate a pulse or scan sequence in a magnetic field created by a main magnet or coil. The whole-body coil or local coils receive signals responsive to the re-orientation of molecules shifted due to the scan sequence. In an embodiment and used as an example below, the MR data may represent image data for an organ of a patient, for example a lung or brain. Different objects, organs, or regions of a patient may also be scanned.

The MR data is k-space data or image data. Image data is MR data after Fourier transform into object space. The image data may be at any point after transform, so may be scalar values or may be formatted as RGB values for a display screen. The MR data may be scan data to be used to generate an image on a display. The MR data may represent volumes. Three-dimensional datasets are obtained. As k-space data, information content may be provided that is responsive to a three-dimensional distribution of locations, but the data itself does not directly represent the locations prior to transform. In alternative embodiments, two-dimensional datasets representing or responsive to tissue in planes are obtained.

Alternative methods may be used to acquire the MR data. The MR data may be acquired remotely from the server or workstation or may be acquired at a different time, for example, hours or days prior to the processing provided below in Acts A120-A140. The MR data may be stored locally onsite or offsite, for example in the cloud.

At act A120, an iterative reconstruction is applied to the MR data. The iterative reconstruction includes three stages, a data fidelity stage (to minimize consistency distance with data measurements), a fingerprint matching stage to keep the data into the manifold of the magnetization responses, and a spatial regularization stage on the contrast images in the compressed domain. The iterative reconstruction takes as input one or more compressed images (or image data). The output of the iterative reconstruction is MR image data that may represent an image and may be displayed to an operator.

Figure 3:
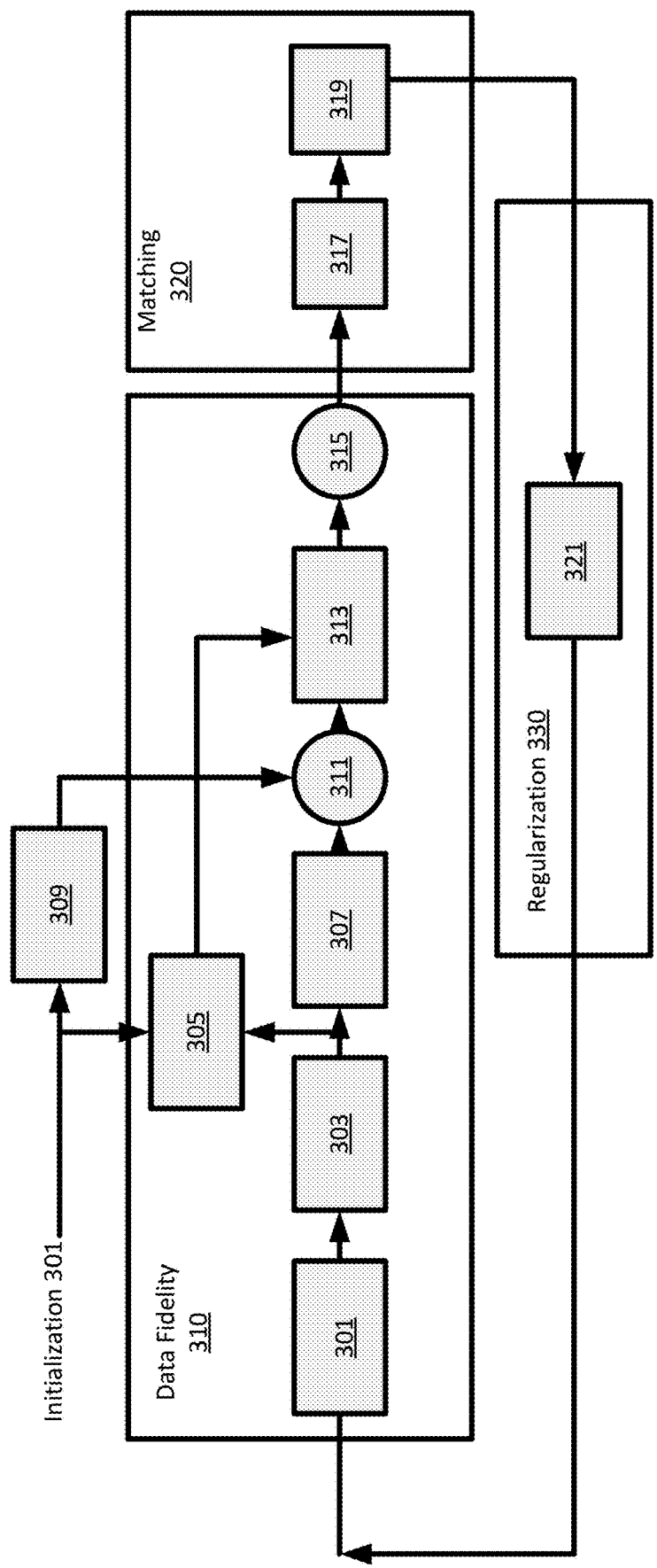
FIG. 3 depicts an iterative process for generating an image using magnetic resonance fingerprinting.

FIG. 3 depicts a schematic diagram of an iterative method for reconstructing an image using MRF. The method includes a data fidelity stage 310, a signal matching stage 320, and a regularization stage 330. In the data fidelity stage 310, an MR k-space signal is prepared to provide data for a dictionary search that occurs in the signal matching stage 320. Each iteration of the method provides a result from the signal matching stage 320 for input to the data fidelity stage 310 for the next iteration. Through iteration, the MR k-space signal may be used to update or modify an image previously generated at the signal matching stage 320.

In a first iteration starting at initialization 301, one or more undersampled k-space signals are acquired from MR data. The undersampled k-space signals are separated temporally. At box 309, the undersampled k-space signals are compressed and an inverse Fourier transform is performed in order to obtain one or more images in a compressed space from the one or more undersampled k-space signals. The MR data may be compressed to a low rank using low rank approximation or other compression algorithm. Low rank approximation is a minimization problem, in which the cost function measures the fit between a given matrix (the MR data) and an approximating matrix (the optimization variable), subject to a constraint that the approximating matrix has reduced rank. The MR data may be compressed to a rank of between 5 and 20. The compression of the MR data imposes low rank upon the regularization stage. The compression of the MR data also provides appropriately compressed data for the matching stage.

The one or more compressed images can be stored at a memory location and can be retrieved during subsequent iterations. Continuing through the data fidelity stage 310, the one or more images in the compressed space are provided to a difference generator 311 that determines a difference between the one or more compressed images and one or more compressed images from a previous iteration. In the first iteration, the "previous" one or more compressed images may be null images or images that are initialized to include non-zero values, such as a temporal average of image values. The one or more compressed images created at the difference generator 311 are scaled by a factor or "step size" a at scaling box 313. The scaled one or more images are then used to update the one or more images from the previous iteration at a summing device 315. The one or more updated images are then provided to the signal matching stage 320.

For second and subsequent iterations, the one or more compressed images output from the regularization process during a previous iteration are provided as input to the data fidelity stage 310. At box 301, the previous one or more compressed images undergo a Fourier transform to obtain k-space data and the resulting k-space data is decompressed. The decompression mirrors the compression. A sampling mask is applied to the decompressed k-space data at box 303. The sampling mask creates an undersampled data set in k-space which is compared at box 303 to the measured undersampled k-space signals to determine a scalar difference between the signals. The scalar difference is used to determine the step size (a) for box 305. This scaling may be applied once at the second iteration or every time for the subsequent iterations. The undersampled data from box 303 is compressed at box 307 and a Fourier transform is performed to obtain one or more compressed images that are output to box 311. The compression is done at a low rank, for example, between 10 or 20 or less than the rank of the dictionary. Imaging issues that occur due to multichannel coil sensitivities that occur during MR data acquisition may be resolved at these stages. In one embodiment, the resolution of such imaging issues occurs during the Fourier transform. At the difference generator, the one or more compressed images are subtracted from the one or more compressed images to generate an image gradient. In one embodiment, the one or more compressed images are images that were stored in a memory location or memory storage device during the first iteration. For the second and subsequent iterations, the initialization steps 301 and 309 may not be performed. For example, as the previous images are taken from the output of the previous iteration and are not, for example, null images. The image gradient is scaled by the determined step size a. The scaled image gradient and the one or more previous images are supplied to the summing device 315. The summing device 315 adds the scaled imaged gradient to the one or more previous images to obtain one or more updated images. The one or more updated images are then supplied from the summing device 315 to the signal matching stage 320.

The signal matching stage 320 receives the one or more updated images from the data fidelity stage 310, determines a time evolution signal for the one or more images and performs a dictionary search at box 317 to locate a fingerprint that is an acceptable match to the time evolution signal. One or more magnetic resonance parameters are associated with the selected fingerprint. By identifying the fingerprint, the signal matching stage 320 provides one or more magnetic resonance parameters that may be used to construct an image at box 319.

As the images received at the signal matching stage 320 are compressed images, the time evolution signal obtained from the one or more images is a compressed time evolution signal that may not be temporally consistent. However, a temporally-consistent time evolution signal may be constructed from the compressed time evolution signal. Once a fingerprint has been selected, the magnetic resonance parameters associated with the fingerprints may be retrieved from the compressed dictionary. The retrieved parameters may be used to generate one or more compressed images. The dictionary search of the signal matching stage 320 includes a step for comparing data and a searching algorithm that determines how to navigate through the compressed dictionary efficiently to locate an optimal or nearest neighbor fingerprint for the time evolution signal. The search step may be computationally expensive. Different techniques may be used to diminish the time or effort for searching. The fingerprint matching is based on a compressed dictionary. The dictionary may be compressed to impose low rank, for example, between 10 or 20 and/or less than the rank of the dictionary.

In an embodiment, the search is performed using a k-d tree search of the compressed dictionary through to select a leaf node of the k-d tree and a search of a selected number of data points within a hypersphere of the selected leaf node to select the magnetic resonance fingerprint representative. Other nearest neighbor search techniques using other tree structure (cover tree, k-means tree), or locality sensitive hashing (LSH) may be used instead.

In one embodiment, the method reduces computation time for comparing data by compressing dictionary entry data to obtain a representation of the dictionary entry in a more compact space. Various compression methods may include an SVD or principal component analysis (PCA). In one embodiment, SVD is used on the dictionary fingerprints in order to reduce the computation time for matching experimentally acquired time evolution signals to fingerprints and for performing the various Fourier transforms of the data fidelity stage 310. The fingerprint dictionary may be compressed much beyond its rank, for example, to a number of components 5 to 20 while the sequence length is generally longer than 300. The compression imposes low rankness on the reconstructed image data.

In an embodiment, the dictionary is compressed using a strong rate, for example, to a number of components related to the rank (e.g. between 5 and 20) of the images data volume reshaped in a matrix form of size "number of pixels" times "number of time points" or compressed to the dictionary rank and then multiplied by an additional compression matrix obtained via an SVD decomposition of some autocalibration data. In this way, a low-rank prior is imposed without the need to perform nuclear norm minimization (SVD followed by singular values thresholding) at each iteration as it is the case for classical low-rank projection.

Computation time is therefore reduced by using the low rank compressed dictionary. Fourier transform times are further reduced by use of SVD compression, since the linearity of the compression allows the Fourier operations to be performed on a reduced set of compressed data. The output of the searching stage 320 is an estimated compressed image. The MR parameters identified during the matching stage are used to generate the estimated compressed image at box 319. In one embodiment, when the matching stage 320 during one iteration does not change much from the query point in the previous iteration, it is possible to skip the first part of search for subsequent iterations in order to speed up the search process. However, removing the first search may degrade search results for when the query point changes significantly.

A matching or pattern recognition algorithm is used to select a signal vector or a weighted set of signal vectors from the compressed dictionary that best correspond to the observed signal evolution. All the parameters that were used to build this signal vector in the dictionary may then be retrieved simultaneously. An estimated compressed image is generated using the one or more of the MR parameters retrieved from the database as a result of the search. The compressed image may also be multiplied by an associated fingerprint in order to modify the compressed images.

The one or more compressed images are further modified by a regularization stage 330. The regularization stage 330 may be used to reduce or correct for noise in the compressed images. Low rank is imposed upon the regularization stage 330 by the compression during the fidelity 310 and signal matching stages 320. Different methods such as Tikhonov regularization, Wavelet image restoration, sparsity based denoising and inversion, or Total Variation (TV) regularization may be used.

At box 321, Spatial regularization is then applied on each slice of the compressed image in the compressed domain for example, using a Chambolle dual algorithm for TV regularization. Other regularization such as L1 in the wavelet domain, joint sparse regularization or the cycle spinning technique may be applied. As the data is highly compressed (only 5 to 20 slice/component images) and the regularization is applied on each component image individually, and Chambolle dual algorithm converges very fast especially in the first iterations (only few iterations may be used (e.g. 5)), the spatial regularization may be executed efficiently. Cycle spinning and joint sparse regularization (using cycle spinning) are even faster technique. If the data is not compressed to impose low-rankness to the image, performing the spatial regularization 330 on each time slice would take larges amount of time and would be inefficient. Alternative algorithms may be used for TV regularization.

The generated compressed images from the regularization stage 330 are provided as input to the data fidelity stage 310 for another iteration. The retrieved parameters may be stored at a memory location or memory storage device and used in subsequent iterations of the signal matching stage 320 to facilitate a subsequent search of the dictionary.

At act A140, the reconstructed object is displayed. After a number of iterations, for example, 5, 10, or 20, the reconstructed object is output for display. The number of iterations may be predefined or may be determined as a function of the output images. For example, the output images from the regularization stage 330 may be compared to initial images to determine if a further iteration is useful or required. Image quality may be determined by using one or more image quality algorithms, for example, that identify noise or quality in the image.

Figure 4:
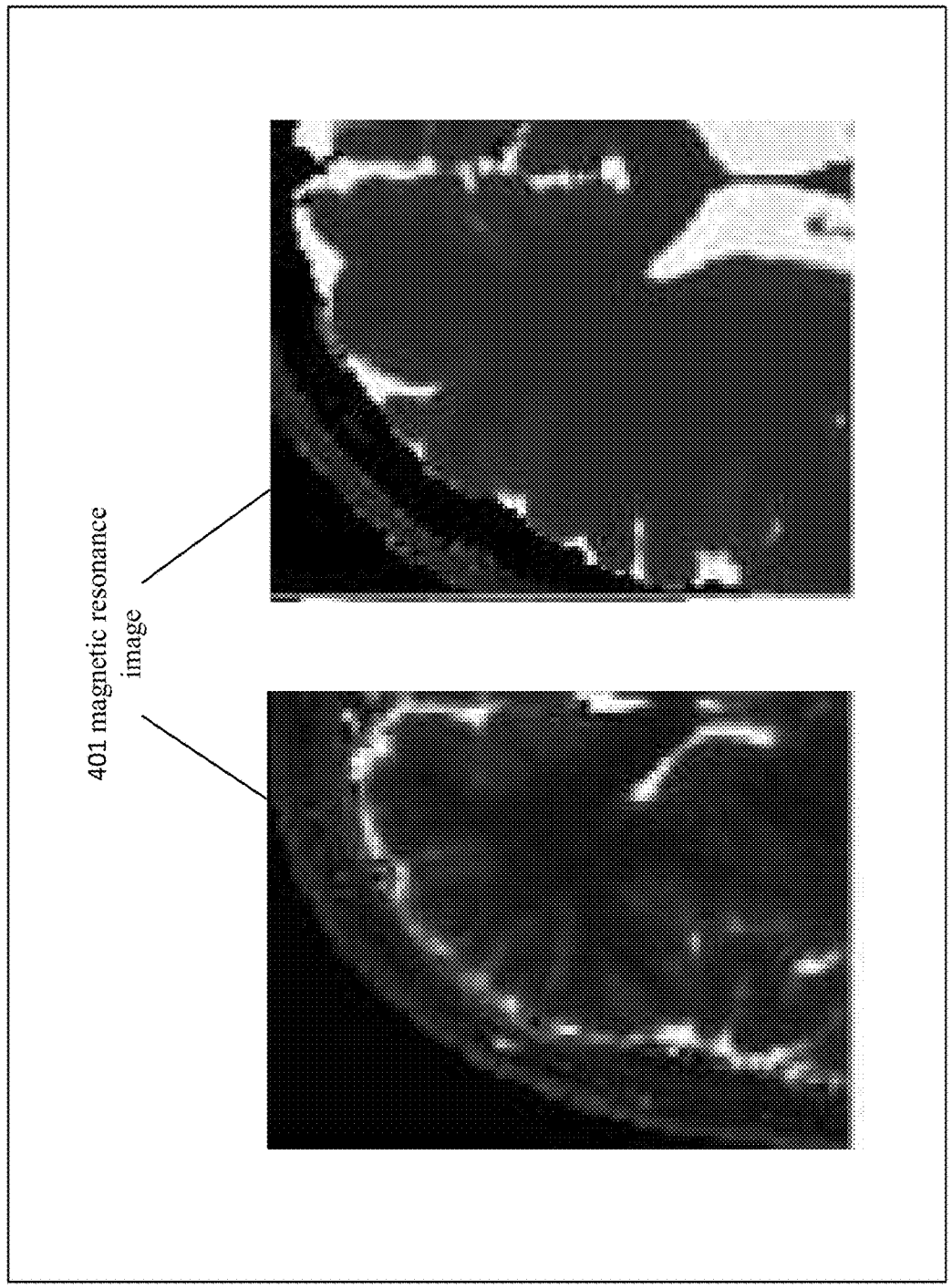
FIG. 4 depicts example output images of the method of FIG. 2.

FIG. 4 depicts example of generated images 401 using the method of FIG. 2. The images may be provided in 2D, 3D, 4D, color, B&W, etc. The image(s) 401 may include annotation or overlays to assist in a diagnosis by an operator. The images 401 may be stored for later use or viewing.

In an embodiment, one method to accelerate the processing is to skip the fingerprint matching except at the first and last iteration. The method may procedure as described above for a first iteration. For a subsequent iteration, the fingerprint matching stage 320 is skipped or ignored. For the last iteration, the fingerprint matching stage 320 is again performed. Skipping the fingerprint matching stage 320 may provide an increase in computational efficiency and may speed up the process. When skipping the fingerprint matching stage 320, the output of the fidelity stage is input directly into the regularization stage 330.

Figure 5:
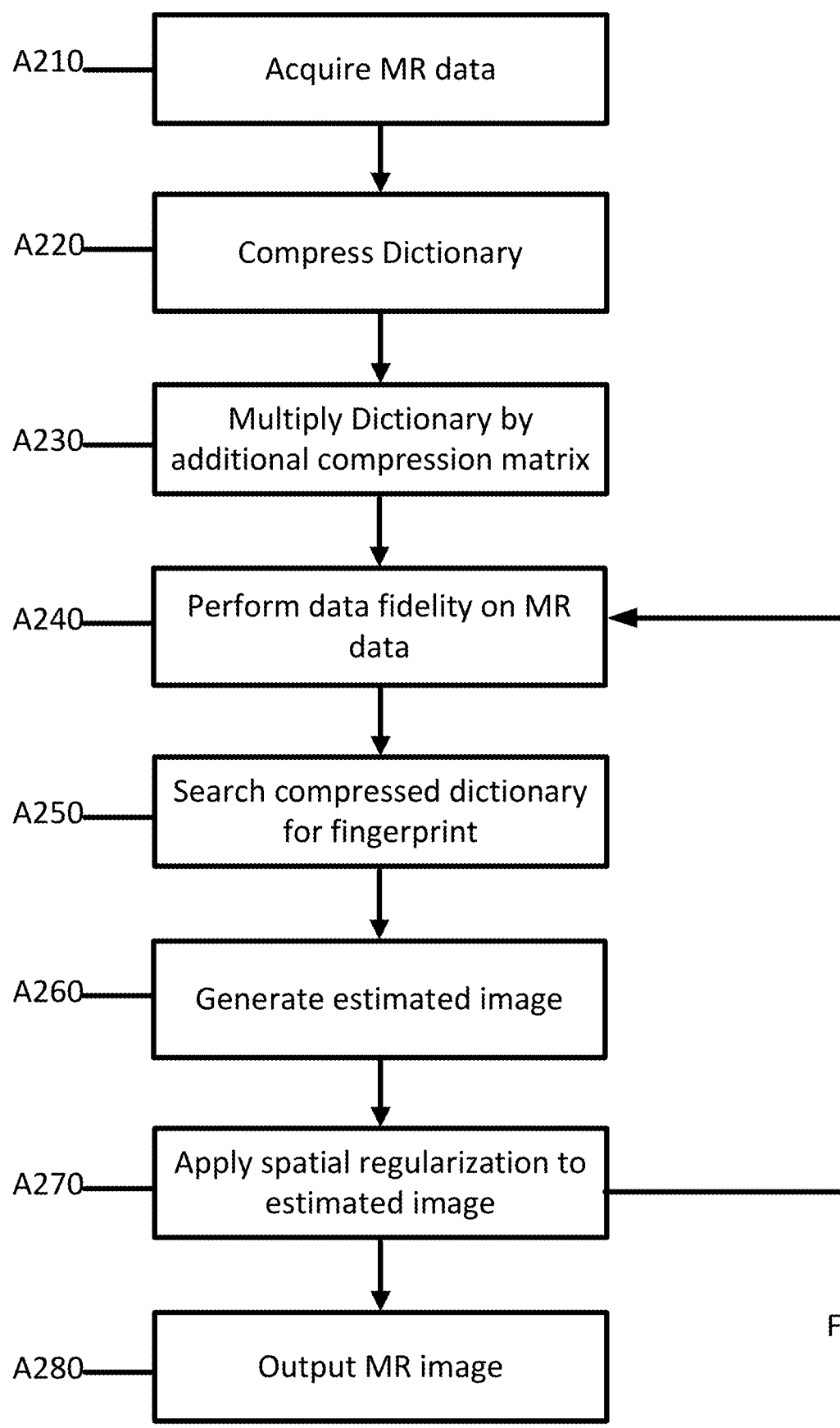
FIG. 5 depicts an example method for generating an image using magnetic resonance fingerprinting.

FIG. 5 depicts one embodiment of a method for generating a magnetic resonance image 401 of an object. The acts are performed by the system of FIG. 1, FIG. 3, FIG. 6, other systems, a workstation, a computer, and/or a server. The acts are performed in the order shown (e.g., top to bottom) or other orders.

At act A210, a compressed image is acquired from one or more magnetic resonance k-space signals obtained from the object. As depicted and described in FIG. 1 above, the MR data may be acquired using MR scanners. For example, gradient coils, a whole-body coil, and/or local coils generate a pulse or scan sequence in a magnetic field created by a main magnet or coil. The whole-body coil or local coils receive signals responsive to the re-orientation of molecules shifted due to the scan sequence. In an embodiment and used as an example below, the MR data may represent image data for a brain of a patient. Different objects, organs, or regions of a patient may also be scanned.

The compressed image may be k-space data or image data. Image data is MR data after Fourier transform into object space. The image data may be at any point after transform, so may be scalar values or may be formatted as RGB values for a display screen. The MR data may be scan data to be used to generate an image on a display. The MR data may represent volumes. Three-dimensional datasets are obtained. As k-space data, information content may be provided that is responsive to a three-dimensional distribution of locations, but the data itself does not directly represent the locations prior to transform. In alternative embodiments, two-dimensional datasets representing or responsive to tissue in planes are obtained.

To generate a compressed image, acquired MR data may be compressed to a low rank using low rank approximation. Low rank approximation is a minimization problem, in which the cost function measures the fit between a given matrix (the MR data) and an approximating matrix (the optimization variable), subject to a constraint that the approximating matrix has reduced rank. The MR data may be compressed to a rank of between 10 and 20. The compression of the MR data imposes low rank upon the regularization stage 330. The compression of the MR data also provides appropriately compressed data for the matching stage.

Alternative methods may be used to acquire the compressed image. The compressed image may be acquired remotely from the server or workstation or may be acquired at a different time, for example, hours or days prior to the processing provided below in Acts A220-A270. The compressed image may be stored locally onsite or offsite, for example in the cloud.

At act A220, a magnetic resonance fingerprint dictionary is compressed to a value of its rank. In an example of a fingerprint dictionary that includes rank 150, the fingerprint dictionary is compressed to rank level 150.

At act A230, the compressed dictionary is multiplied by an additional compression matrix obtained via a Singular Value Decomposition algorithm applied on auto-calibration data. The auto-calibration data may be obtained by running an AIR-MRF algorithm for one iteration (similarly MRF or SVD-MRF) and taking the resulting image as autocalibration data. An SVD is computed on the compressed autocalibration data (i.e. after being compressed with the dictionary compression matrix), and the singular vectors corresponding to the largest singular values, are used to build the autocalibration compression matrix. Each data voxel x is then represented as: x=VdVr a where x is a vector of length L and "a" is the LR vector of length k with k<<L.

At act A240, data fidelity is performed on the compressed image. The compressed images are provided to a difference generator that determines a difference between the one or more compressed images and one or more compressed images from a previous iteration. For a first iteration where there are no previous generated compressed images, the "previous" one or more compressed images may be null images or images that are initialized to include non-zero values, such as a temporal average of image values. The one or more compressed images created at the difference generator are scaled by a factor or "step size" a at scaling box. The scaled one or more images are then used to update the one or more images from the previous iteration at a summing device. The one or more updated images are then provided to the signal matching stage 320.

For subsequent iterations, the one or more compressed images output from the regularization process during a previous iteration are provided as input to the data fidelity stage 310. The previous one or more compressed images undergo a Fourier transform to obtain k-space data and the resulting k-space data is decompressed. The decompression mirrors the compression step. A sampling mask is applied to the decompressed k-space data. The sampling mask creates an undersampled data set in k-space which is compared to the measured undersampled k-space signals to determine a scalar difference between the signals. The scalar difference is used to determine the step size (a) for box. This scaling may be applied once at the second iteration or every time for the subsequent iterations. The undersampled data from box is compressed and a Fourier transform is performed to obtain one or more compressed images. The compression is done at a low rank, for example, between 10 or 20 or less than the rank of the dictionary. Imaging issues that occur due to multichannel coil sensitivities that occur during MR data acquisition may be resolved at these stages. In one embodiment, the resolution of such imaging issues occurs during the Fourier transform. At the difference generator, the one or more compressed images are subtracted from the one or more compressed images to generate an image gradient. In one embodiment, the one or more compressed images are images that were stored in a memory location or memory storage device during the first iteration. For the second and subsequent iterations, the initialization steps may not be performed. For example, as the previous images are taken from the output of the previous iteration and are not, for example, null images. The image gradient is scaled by the determined step size a. The scaled image gradient and the one or more previous images are supplied to the summing device. The summing device adds the scaled imaged gradient to the one or more previous images to obtain one or more updated images. The one or more updated images are then supplied from the summing device to the signal matching stage 320.

At act A250, the compressed dictionary is searched for a representative magnetic resonance fingerprint. The signal matching stage 320 receives the one or more updated images from the data fidelity stage 310, determines a time evolution signal for the one or more images and performs a dictionary search to locate a fingerprint that is an acceptable match to the time evolution signal. One or more magnetic resonance parameters are associated with the selected fingerprint. By identifying the fingerprint, the signal matching stage 320 provides one or more magnetic resonance parameters that may be used to construct an image.

At act A260, an updated compressed image is generated using the representative magnetic resonance fingerprint. Once a fingerprint has been selected, the magnetic resonance parameters associated with the fingerprints may be retrieved from the compressed dictionary. The retrieved parameters may be used to generate one or more compressed images. The dictionary search of the signal matching stage 320 includes a step for comparing data and a searching algorithm that determines how to navigate through the compressed dictionary efficiently to locate an optimal or nearest neighbor fingerprint for the time evolution signal.

At act A270, spatial regularization is applied to the updated compressed image. Spatial regularization may use a Chambolle dual algorithm for TV regularization. Other regularization such as L1 in the wavelet domain or the cycle spinning technique or joint sparse regularization may be applied. As the data is highly compressed (only 5 to 20 slice/component images) and the regularization is applied on each component image individually, and Chambolle dual algorithm converges very fast especially in the first iterations (only few iterations may be used (e.g. 5)), the spatial regularization may be executed efficiently. Cycle spinning or joint spare regularization may be even faster. If the data is not compressed to impose low-rankness on the image, performing the spatial regularization on each time slice would take larges amount of time and would be inefficient. Alternative algorithms may be used for TV regularization.

At act A280, the method outputs an MR image. Acts A240-A270 are repeated for a plurality of iterations. The number of iterations may range from as few as two to as many as 5, 10, 20, or 100. The number of iterations may be predetermined. In an embodiment, one way to accelerate the algorithm is to skip the fingerprint matching (Acts A250 and A260) except at the first and last iteration.

Figure 6:
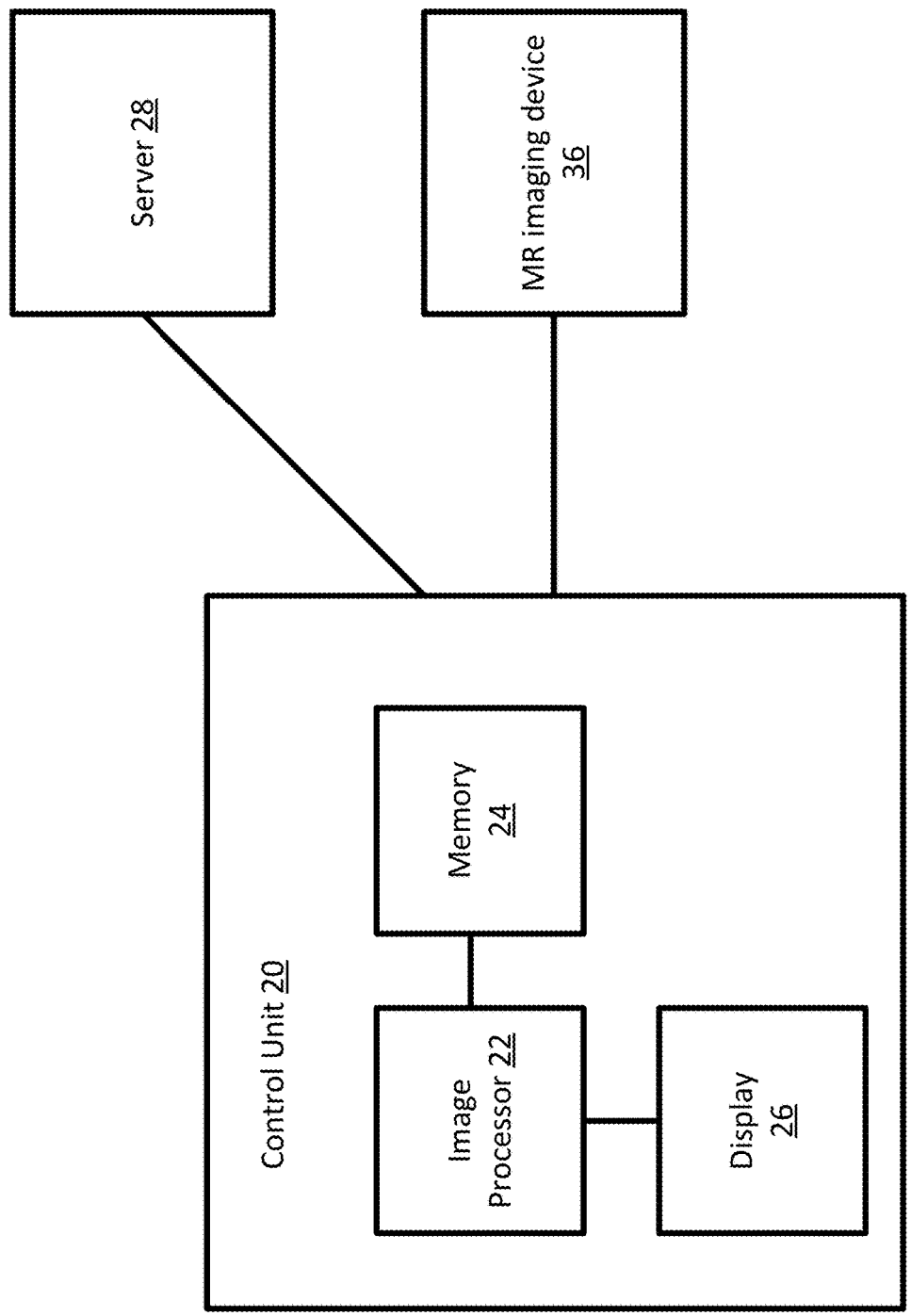
FIG. 6 depicts example system for generating an image using magnetic resonance fingerprinting.

FIG. 6 depicts one embodiment of a control unit for generating an image from MR data using magnetic resonance fingerprinting. The control unit includes an image processor 22, a memory 24, and a display 26. The control unit 20 may be connected with a server 28 and an MR imaging device 36. Additional, different, or fewer components may be provided. For example, network connections or interfaces may be provided, such as for networking between the control unit 20 and server 28. A workstation with a user interface may be provided for an operator to input data.

The MR imaging device 36 may be similar to the MR imaging device as depicted in FIG. 1. The MR imaging device 36 is configured to acquire MR data that may be processed into one or more images by the control unit 20. The control unit 20 may provide commands to the MR imaging device 36. Alternatively, the MR imaging device 36 may function entirely on its own without any input from the control unit 20.

The image processor 22 (or processor) is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for processing an image. The processor 22 is a single device or multiple devices operating in serial, parallel, or separately. The processor 22 may be a main processor of a computer, such as a laptop or desktop computer, or may be a processor for handling some tasks in a larger system, such as in the MRI system. The processor 22 is configured by instructions, design, hardware, and/or software to perform the acts discussed herein.

The server 28 may be co-located with the control unit 20 or may be located remotely. The server 28 may connect to the MRI system 100 or control unit 20 via a network. The network is a local area, wide area, enterprise, another network, or combinations thereof. In one embodiment, the network is, at least in part, the Internet. Using TCP/IP communications, the network provides for communication between the processor 24 and the server 28. Any format for communications may be used. In other embodiments, dedicated or direct communication is used.

The server 28 may include the processor 24 or group of processors. More than one server 28 or control unit 20 may be provided. The server 28 is configured by hardware and/or software. The server 28 may acquire and the memory 24 may store MR data from multiple different MRI systems. The processor 24 and/or server 28 are configured to perform the acts discussed above for generating an image using magnetic resonance fingerprinting. The processor 24 and/or server 28 may access and implement the code stored in memory 24.

The memory 24 may be a graphics processing memory, a video random access memory, a random-access memory, system memory, cache memory, hard drive, optical media, magnetic media, flash drive, buffer, database, combinations thereof, or other now known or later developed memory device for storing data or video information. The memory 24 is part of the control unit 20, part of a database, part of another system, a picture archival memory, or a standalone device. The memory 24 may store data from the MRI system. The memory 24 may store an instruction set or computer code configured to implement the low rank and spatial regularization model for MRF.

In an embodiment, the memory 24 stores an instruction set or computer code for an iterative gradient proximal algorithm for MRF where the estimated image series X is estimated according to the following three steps: 1) gradient step to improve data consistency, 2) fingerprint matching, 3) spatial regularization via total variation (TV) regularization. Fingerprint SVD compression along the time dimension is used to accelerate both the matching and the spatial regularization that operates in the compressed domain as well as to enforce low-rank regularization. The dictionary is compressed to a small rank value (e.g. k=10). The three step iterative algorithm may be formalized as the following process:

while $k < K_{max}$ do
  | Gradient update:
  | $\hat{X}_c^{(k+1/3)} := X_c^{(k)} - \alpha_k \mathcal{G}^H (\mathcal{G}(\hat{X}_c^{(k)}) - Y)$
  | Fingerprint matching:
  | $[\hat{X}_c^{(k+2/3)}, \hat{\theta}, \hat{\rho}] := \mathcal{P}_{\mathcal{D}_c}(\hat{X}_c^{(k+1/3)})$
  | Spatial regularization:
  | $\hat{X}_c^{(k+1)} := \text{prox}_{\alpha_k \lambda \mathcal{R}}(\hat{X}_c^{(k+2/3)})$
  | $k := k + 1$
  | return $\hat{X}_c^{(k+1)}, \hat{\theta}, \hat{\rho}$
end where $\hat{X}_c$ is the estimated compressed image series, $\hat{\theta}$ are the estimated T1 and T2 maps, $\hat{\rho}$ is the estimated proton density map, $G = \mathcal{MCHFS}$ is the observation operator, which integrates the compression C (note that the compression operator and the Fourier operator commute), the coil sensitivity map S, the Fourier transform F, and the under sampling operator M. R is the regularization operator which enforces spatial regularization (e.g. TV regularization). The proximal operator is performed via the Chambolle dual algorithm or cycle spinning. The memory may store an instruction set for obtaining a magnetic resonance image 401 of an object, the method including: obtaining a compressed image from one or more magnetic resonance k-space signals obtained from the object; reconstructing the object including: applying low rank regularization by generating an initial compressed dictionary; applying a regularization in the compressed image domain; and displaying the reconstructed object.

The memory 24 stores an instruction set or computer code where the dictionary is compressed to a value of its rank and where the dictionary compression matrix is multiplied by an additional compression matrix obtained via a Singular Value Decomposition (SVD) algorithm applied on auto-calibration data. The memory 24 stores an instruction set or computer code where the dictionary is compressed to a value of a rank of contrast images data volume reshaped in a matrix form of size comprising number of pixels multiplied by a number of time points. The memory 24 stores an instruction set or computer code where low rank prior is imposed without a need to perform nuclear norm minimization. The memory 24 stores an instruction set or computer code where the regularization is a spatial regularization. The memory 24 stores an instruction set or computer code where the spatial regularization is applied using one of Chambolle dual algorithm for total variation (TV) regularization, L1 in the wavelet domain, joint sparse regularization or the cycle spinning technique.

The memory 24 or other memory is alternatively or additionally a non-transitory computer readable storage medium storing data representing instructions executable by the programmed processor 22 for generating protocol independent segmented image data 439. The instructions for implementing the processes, methods and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code, and the like, operating alone, or in combination. Likewise, processing strategies may include multiprocessing, multitasking, parallel processing, and the like.

The display 26 may be configured to display images to an operator. The display 26 may augment the images with additional information or overlays. The display 26 may be configured to display the images in two dimensions, three dimensions, or, for example, in augmented or virtual reality scenarios.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method for obtaining a magnetic resonance image of an object, the method comprising:
    acquiring a compressed image from one or more magnetic resonance k-space signals obtained from the object;
    compressing a dictionary to a value of a low rank;
    iteratively reconstructing the magnetic resonance image, wherein each iteration comprises:
        updating a gradient of the compressed image;
        performing a search of the compressed dictionary to select a magnetic resonance fingerprint representative;
        generating an updated compressed image using the magnetic resonance fingerprint representative; and
        applying regularization to the updated compressed image; wherein the updated compressed image is used as input for a subsequent iteration;
    displaying the magnetic resonance image.

2. The method of claim 1, wherein the value of the low rank is between 5 and 20.

3. The method of claim 1, wherein the value of the low rank is 10.

4. The method of claim 1, wherein the value of the low rank is that of a contrast images data volume reshaped in a matrix form of size comprising a number of pixels multiplied by a number of time points.

5. The method of claim 1, wherein applying regulation comprises applying spatial regularization.

6. The method of claim 5, wherein applying spatial regularization comprises applying spatial regularization using one of: Chambolle dual algorithm for total variation (TV) regularization, L1 thresholding in a wavelet domain, Chambolle-Pock algorithm for L1 minimization on a redundant sparse representation, joint sparse regularization, or a cycle spinning technique.

7. The method of claim 1, wherein performing the search of the compressed dictionary comprises performing a nearest neighbor search technique search comprising a k-d tree search.

8. The method of claim 1, wherein iteratively reconstructing comprises at least three iterations.

9. The method of claim 8, wherein the search of the compressed dictionary is only performed at the first and last iteration.

* * * * *